United States Patent [19]

Lee et al.

[11] Patent Number: 5,677,206
[45] Date of Patent: Oct. 14, 1997

[54] METHOD OF MAKING A POLY-SILICON THIN FILM TRANSISTOR HAVING LIGHTLY DOPED DRAIN STRUCTURE

[75] Inventors: Joo-Hyung Lee; Suk-Bum Mah, both of Seoul; Jin-Hong Kim, Suwon, all of Rep. of Korea

[73] Assignee: Samsung Electronics Co., Ltd., Suwon, Rep. of Korea

[21] Appl. No.: 605,515

[22] Filed: Feb. 26, 1996

[30] Foreign Application Priority Data

Feb. 24, 1995 [KR] Rep. of Korea ............... 95-3708

[51] Int. Cl.⁶ .................................................. H01L 21/84
[52] U.S. Cl. ............................. 437/21; 437/42; 437/44
[58] Field of Search .......................... 437/21, 41, 42, 437/44, 978

[56] References Cited

U.S. PATENT DOCUMENTS

| | | | |
|---|---|---|---|
| 5,064,775 | 11/1991 | Chang | 437/40 |
| 5,436,481 | 7/1995 | Egawa et al. | 257/324 |
| 5,464,783 | 11/1995 | Kim et al. | 437/42 |

FOREIGN PATENT DOCUMENTS 6-232160A  8/1994  Japan .................. 437/21

*Primary Examiner*—John Niebling
*Assistant Examiner*—Richard A. Booth
*Attorney, Agent, or Firm*—Cushman Darby & Cushman, IP Group Of Pillsbury Madison & Sutro LLP

[57] ABSTRACT

A poly-silicon thin film transistor having LDD structure which has very low source/drain resistance is described. A TFT according to a preferred embodiment of the present invention, has, on a substrate, an active poly-silicon layer with a heavily-doped region on an outer peripheral thereof, a lightly doped region on ban inside the outer peripheral band and an un-doped region on a center part thereof. A gate insulating layer is comprised of a lower oxide layer, a nitride layer and an upper oxide layer. The lower oxide layer is formed over the whole active poly-silicon layer, but the nitride layer and the upper oxide layer are formed only on the un-doped portions of the active poly-silicon layer. A gate electrode is then formed on the upper oxide layer. A method for forming this structure is also described, which method uses a dry etch to remove the upper oxide layer and the nitride layer, but not the lower oxide layer prior to ion implantation of the active region.

8 Claims, 4 Drawing Sheets

5,677,206

1

METHOD OF MAKING A POLY-SILICON THIN FILM TRANSISTOR HAVING LIGHTLY DOPED DRAIN STRUCTURE

BACKGROUND OF THE INVENTION (1) Field of the Invention

The present invention relates to a poly-silicon thin film transistor having LDD (Lightly Doped Drain) structure and a process for manufacturing the same, and more particularly to a poly-silicon thin film transistor having an LDD structure which has very low source/drain resistance as a result of implanting heavy impurities using a low energy ion-implantation method and a process for manufacturing the same.

(2) Description of the Related Art

Generally, it desirable to diminish the thickness of a gate insulating layer of a poly-silicon thin film transistor. (hereinafter referred to as a TFT) having a top gate structure for liquid crystal displays (hereinafter referred to as LCDs) to obtain high-resolution display. However, a thin oxide layer which is commonly employed as a gate insulating layer has a disadvantage of allowing leakage current to penetrate.

SONY of Japan has proposed a process of manufacturing a thinner gate insulating layer that prevents leakage current. This LDD structure which uses a poly-silicon TFT for a LCD is described below with referenced to FIG. 1. The LDD structure is characterized by a gate insulating layer which has an ONO (Oxide/Nitride/Oxide) structure which consists of a lower thermal oxide layer 12, an insulating layer 13 and an upper thermal oxide layer 14.

The method of manufacturing this poly-silicon TFT-LCD will be described below with reference to FIG. 2A to FIG. 2E. An active poly-silicon 11 is initially deposited on a substrate. Thereafter, there occurs depositing a lower thermal oxide layer 12 on the active poly-silicon layer depositing a nitride layer 13 on the lower thermal oxide layer 12 and depositing an upper thermal oxide layer 14 on the nitride layer 13. A gate poly-silicon pattern is formed by depositing a gate poly-silicon 15 on the upper thermal oxide layer 14 and then patterning the layer 15 (See FIG. 2A). A top thermal oxide layer pattern is formed by depositing the top thermal oxide layer 16 over the gate poly-silicon pattern and then patterning the layer. Thereafter, low-dose ions are ion implanted in the active poly-silicon using a mask to form a lightly doped region 18 (See FIG. 2B). Then a poly-spacer 17 is formed on the top thermal oxide layer pattern (See FIG. 2C). Thereafter, high-dose ions are ion implanted in the active poly-silicon through the gate insulating layer which is not covered with the poly-spacer to form heavily doped region 19 (See FIG. 2D). Finally, the poly-spacer 17 is removed (See FIG. 2E).

The LDD structure of a poly-silicon TFT-LCD manufactured by above process still has disadvantages. First, the thickness of the ONO (Oxide/Nitride/Oxide) insulating layer is restricted because of undesired charge-up of the active poly-silicon and photoresist-burning while implanting ions in the active poly-silicon. Second, when the thickness of the ONO layer to increased sufficiently to obtain reliable gate insulating characteristics, it is difficult to implant a sufficient amount of ions in the active poly-silicon without charging up the active poly-silicon or burning the photoresist.

SUMMARY OF THE INVENTION

In view of the above, it is an object of the present invention to provide a poly-silicon thin film transistor having a LDD structure which as very low source/drain resistance.

2

Another object of this invention is to provide a method for manufacturing the same by ion-implanting heavy impurities (or high dose implant) with low energy by an ion implantation process while increasing thickness of an ONO insulating layer.

A TFT according to a preferred embodiment of the present invention, has, on a substrate, an active poly-silicon layer with a heavily-doped region on an outer peripheral thereof, a lightly doped region on ban inside the outer peripheral band and an un-doped region on a center part thereof. A gate insulating layer is comprised of a lower oxide layer, a nitride layer and an upper oxide layer. The lower oxide layer is formed over the whole active poly-silicon layer, but the nitride layer and the upper oxide layer are formed only on the un-doped portions of the active poly-silicon layer. A gate electrode is then formed on the upper oxide layer.

A method for manufacturing the poly-silicon TFT of this invention includes the steps of depositing an active poly-silicon layer on a substrate; depositing a lower oxide layer over the active poly-silicon layer; depositing a nitride layer over the lower oxide layer; forming a gate electrode over the upper oxide layer; removing the upper oxide layer and the nitride layer by photolithography (Dry Etching); forming a lightly doped region by implanting low-dose ions in the active poly-silicon through the lower oxide layer; forming a poly-spacer pattern by depositing a poly-spacer on the gate electrode and then patterning the poly-spacer; implanting high-dose ions in the active poly-silicon through the region of the lower oxide layer which is not covered with the poly-spacer to form a heavily doped region; and removing the poly-spacer.

DETAILED DESCRIPTION OF THE PREFERRED EMBODIMENT

Figure 1:
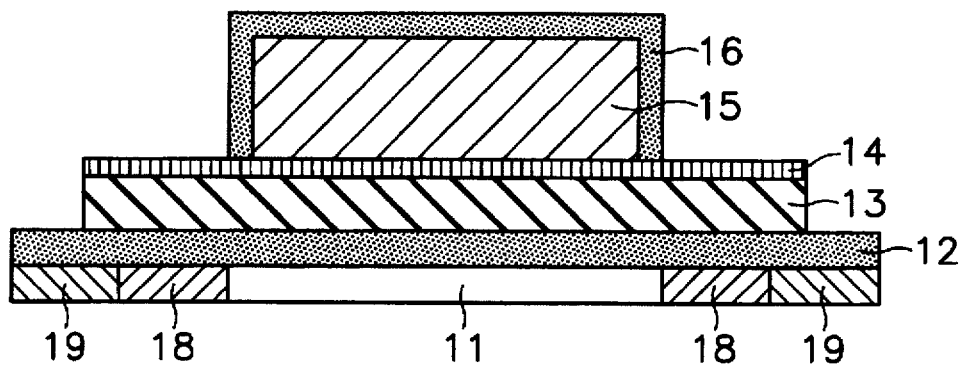
FIG. 1 is a cross-sectional view of a conventional LDD structure of a poly-silicon TFT for a LCD.
Figure 2A:
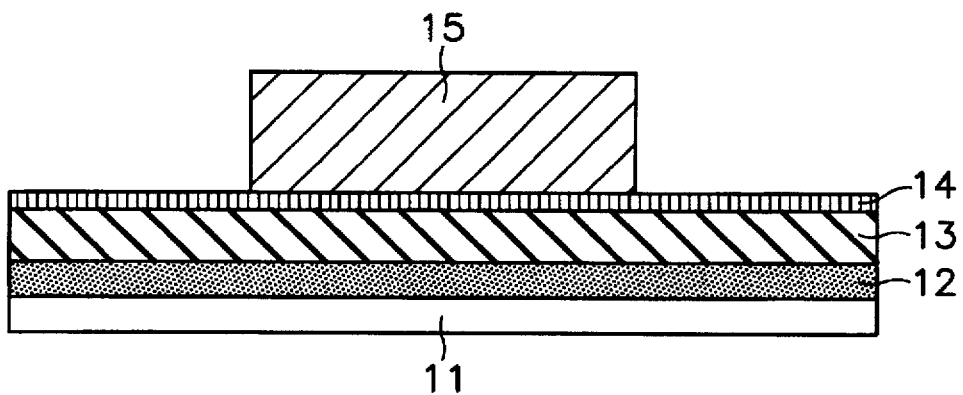
FIGS. 2A to 2E show the process of manufacturing the conventional LDD structure of a poly-silicon TFT for a LCD illustrated in FIG. 1.
Figure 2B:
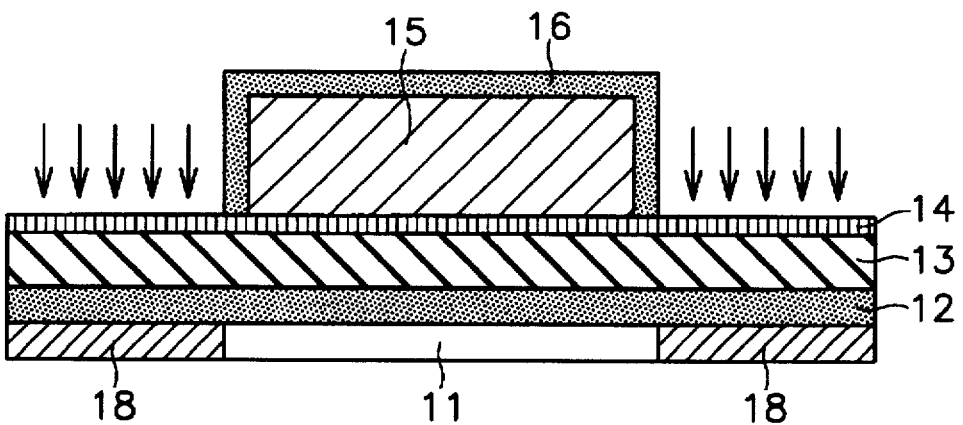
Figure 2C:
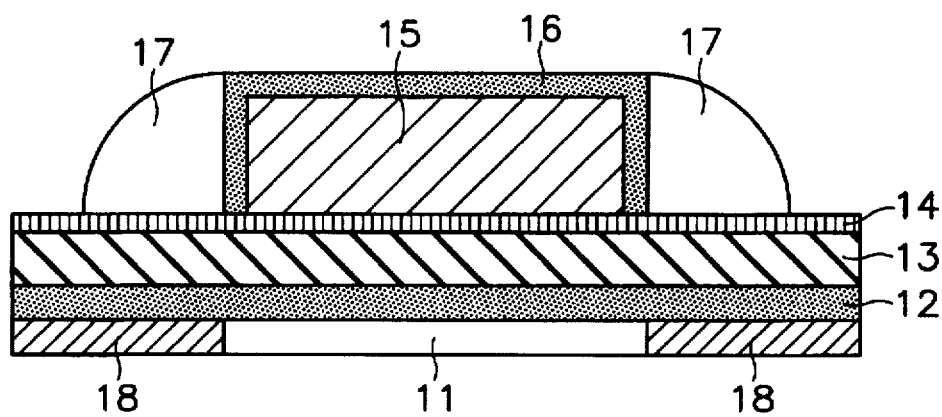
Figure 2D:
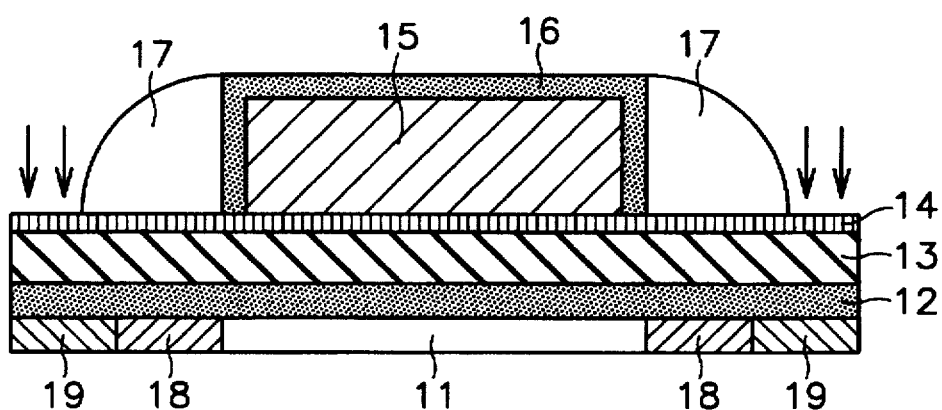
Figure 2E:
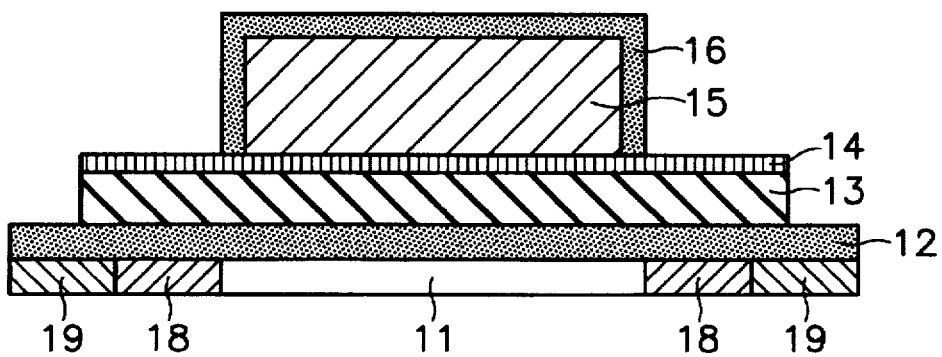
Figure 3:
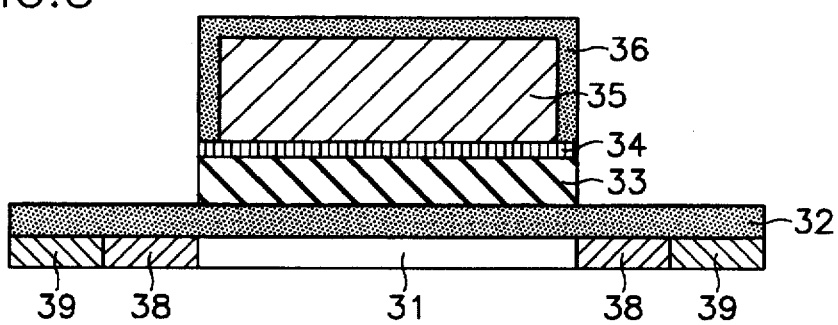
FIG. 3 is a cross-sectional view of a LDD structure of a poly-silicon TFT for a LCD according to the present invention.

A preferred embodiment of the present invention is described below with reference to the accompanying drawings. As shown in FIG. 3, the LDD structure of a poly-silicon TFT for a LDD according to the preferred embodiment of this invention has an active poly-silicon layer 31 on a substrate which has an outer band of a heavily-doped region 39 on an outer peripheral of the active poly-silicon layer. A lightly-doped region 38 is formed on an inner band that is adjacent to the heavily doped outer band 39. An un-doped region exists in the center of the active poly-silicon layer. A gate insulating layer exists on the active poly-silicon layer 31 and has an ONO structure which consists of a lower thermal oxide layer 32, a patterned nitride layer 33 and a patterned upper thermal oxide layer 34. The lower oxide layer is formed on the whole region of the active poly-silicon layer, while the nitride layer and the upper oxide layer are formed only on the un-doped region of the active poly-silicon layer. A patterned gate poly-silicon 35 exists on the upper thermal oxide layer pattern 34 and a patterned top thermal oxide layer 36 exists on the gate poly-silicon layer 35.

Figure 4A:
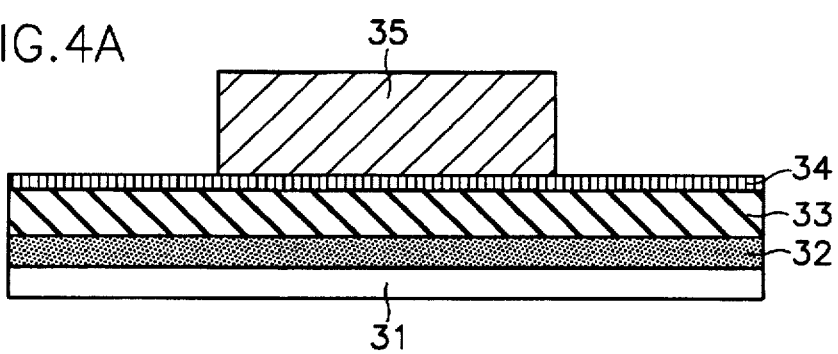
FIGS. 4A to 4G show the process of manufacturing the LDD structure of a poly-silicon TFT for a LCD according to the present invention.
Figure 4B:
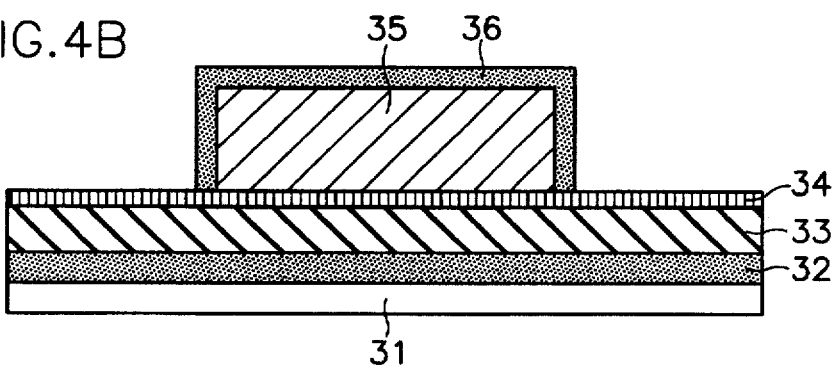
Figure 4C:
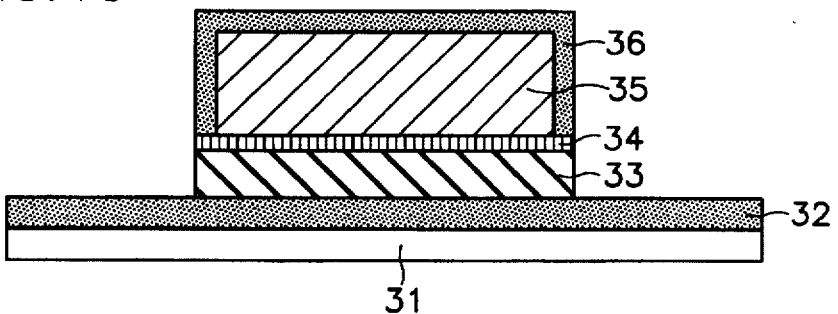
Figure 4D:
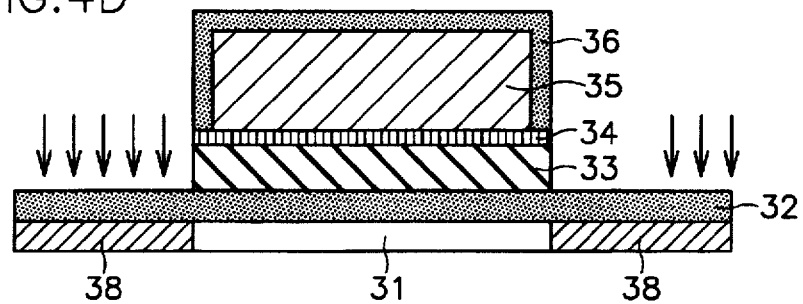
Figure 4E:
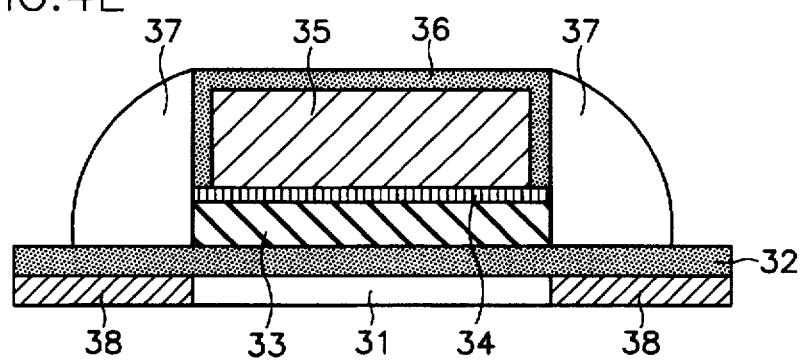
Figure 4F:
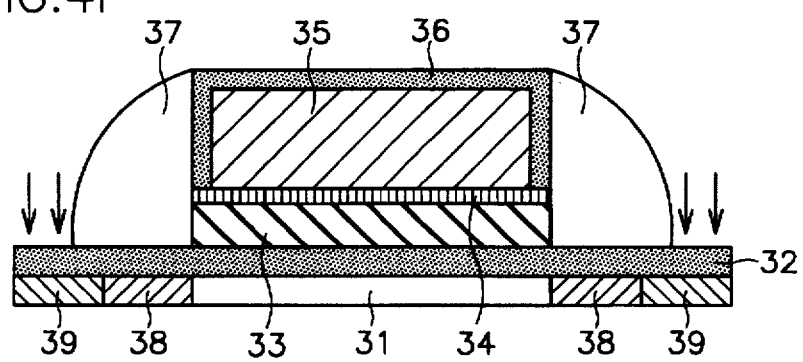
Figure 4G:
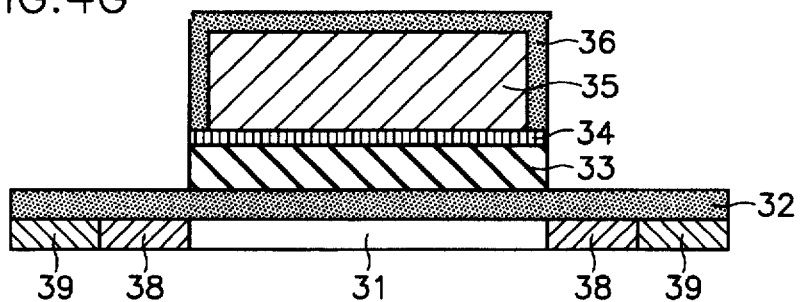

The process for manufacturing the poly-silicon TFT of this invention will now be described in more detail. FIG. 4A illustrates depositing the active poly-silicon 31 over the substrate; depositing the lower thermal oxide layer 32 over the active poly-silicon layer 31; depositing the nitride layer 33 over the lower thermal oxide layer 32; depositing the upper thermal oxide layer 34 over the nitride layer 33; and forming the gate poly-silicon pattern by depositing a gate poly-silicon 35 over the upper thermal oxide layer 34 and then patterning the gate poly-silicon. FIG. 4B illustrates the structure after depositing the top thermal oxide layer 36 over the gate poly-silicon pattern 35. Subsequently, as shown in FIG. 4C, the upper thermal oxide layer 34 and the nitride layer 33 of the LDD structure are removed by photolithography (Dry Etching). In this process, the top thermal oxide layer 36 can be used as a mask and the selectivity ratio of etching between the upper thermal oxide layer and the nitride layer is preferably less than 1:2. FIG. 4D shows the process of forming a lightly doped region 38 by implanting low-dose ions in the active poly-silicon 31 through the lower thermal oxide layer 32. As shown in FIG. 4E, the poly-spacer pattern 37 is made by forming poly-spacer 37 on the top thermal oxide layer pattern 36 and then patterning the poly-spacer. In this process, a poly-silicon can be used as the poly-spacer and the thickness of the poly-spacer is in the range of 1000-4000 Å. FIG. 4F shows the process of implanting high-dose ions in the active poly-silicon 31 through the region of the lower thermal oxide layer 32 which is not covered with poly-spacer 37 to form a heavily doped region 39. The fabrication of this LDD structure of this invention is completed by removing the poly-spacer 37, as shown in FIG. 4G.

One of the main advantages of the LDD structure of poly-silicon TFT of this invention are that there is less photoresist-burning and charge-up phenomena in the ion-implantation process, which results in less leakage-current in operating the TFT for LCD than the conventional TFT commonly used in a LCD.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method of manufacturing a poly-silicon thin film transistor comprising the steps of:

depositing an active poly-silicon layer on a substrate;

depositing a lower oxide layer over said active poly-silicon layer;

depositing a nitride layer over said lower oxide layer;

depositing an upper oxide layer over said nitride layer;

forming a gate electrode over said upper oxide layer;

removing portions of said upper oxide layer and said nitride layer by photolithography using said gate electrode as a mask to expose portions of said lower oxide layer;

forming a lightly doped region by implanting ions at a lower-dose in said active poly-silicon layer through the exposed portion of the lower oxide layer using said gate electrode as a first mask;

forming a poly-spacer pattern by depositing a poly-spacer and then patterning said poly-spacer pattern so that a poly-spacer is located over a portion of said lower oxide layer adjacent said gate electrode;

implanting ions at a high-dose in said active poly-silicon layer through said lower oxide layer using said gate electrode and poly-spacer as a second mask to form a heavily doped region in an outer peripheral portion of said active poly-silicon; and removing the poly-spacer.

2. The method of manufacturing a poly-silicon thin film transistor of claim 1, further comprising the step of forming a top oxide layer over said gate electrode before forming said poly-spacer.

3. The method of manufacturing a poly-silicon thin film transistor of claim 1, wherein said step of forming said gate electrode forms said gate electrode of poly-silicon.

4. The method of manufacturing a poly-silicon thin film transistor of claim 1 wherein said removing step uses a dry etch.

5. The method of manufacturing a poly-silicon thin film transistor of claim 4, wherein a selectivity ratio of etching between said upper oxide layer and said nitride layer is less than 1:2 during said removing step.

6. The method of manufacturing a poly-silicon thin film transistor of claim 1, wherein said step of forming said poly-spacer forms said poly-spacer of poly-silicon.

7. The method of manufacturing a poly-silicon thin film transistor of claim 6, wherein a thickness of said poly-spacer is in the range of 1000-4000 Å.

8. The method of manufacturing a poly-silicon thin film transistor of claim 1, wherein said steps of depositing said lower oxide layer and depositing said upper oxide layer are performed using thermal oxidation.

* * * * *